United States Patent
Jang et al.

(10) Patent No.: US 6,245,620 B1
(45) Date of Patent: Jun. 12, 2001

(54) METHOD FOR FOAMING MOS TRANSISTOR HAVING BI-LAYERED SPACER

(75) Inventors: Keung-hee Jang, Kyungki-do; Eun-ha Lee, Chungcheongnam-do, both of (KR)

(73) Assignee: Samsung Electronics Co., Ltd., Suwon (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/327,459

(22) Filed: Jun. 8, 1999

(30) Foreign Application Priority Data

Jun. 12, 1998 (KR) .................................................. 98-21967

(51) Int. Cl.⁷ .................................................. H01L 21/331
(52) U.S. Cl. ........................... 438/303; 438/304; 257/408
(58) Field of Search ...................... 438/591, 587, 438/588, 595, 301, 303, 304; 257/408, 409

(56) References Cited

U.S. PATENT DOCUMENTS

| | | | |
|---|---|---|---|
| 4,366,613 | 1/1983 | Ogura et al. . | |
| 5,183,771 * | 2/1993 | Mitsui et al. | 438/303 |
| 5,198,386 * | 3/1993 | Gonzalez | 438/304 |
| 5,208,472 * | 5/1993 | Su et al. | 257/344 |
| 5,714,413 * | 2/1998 | Brigham et al. | 438/301 |
| 5,925,918 * | 7/1999 | Wu et al. | 438/595 |
| 6,013,547 * | 1/2000 | Liaw | 438/238 |

FOREIGN PATENT DOCUMENTS 6168955    6/1994   (JP) .

* cited by examiner

Primary Examiner—David Nelms
Assistant Examiner—Dung A Le
(74) Attorney, Agent, or Firm—Jones Volentine, L.L.C.

(57) ABSTRACT

A method is provided for forming a MOS transistor in a highly integrated semiconductor device. In this method a gate pattern is initially formed over a semiconductor substrate. A first dielectric film is then formed over the gate pattern at a first temperature at which deformation or oxidation of a conductive material film forming the gate pattern is prevented. A denser second dielectric film is then formed over the first dielectric film at a second temperature higher than the first temperature. The second and first dielectric film are then anisotropically etched in sequence to form bi-layered spacers on the side walls of the gate pattern, including the first and second dielectric films. Because the deformation of the conductive material film forming the gate pattern is suppressed by forming the first dielectric film at a low temperature, the resistance of the gate electrodes resulting from this fabrication process remains low.

21 Claims, 3 Drawing Sheets

METHOD FOR FOAMING MOS TRANSISTOR HAVING BI-LAYERED SPACER

This application relies for priority upon Korean Patent Application No. 98-21967, filed on Jun. 12, 1998, the contents of which are herein incorporated by reference in their entirety.

BACKGROUND OF THE INVENTION

The present invention relates to a semiconductor device manufacturing method. More particularly, the present invention relates to a method for forming a MOS transistor having a bi-layered spacer.

As semiconductor devices become more highly integrated, there is a need to decrease the size of MOS transistors used for semiconductor devices. This reduction in the size of MOS transistors causes a short channel effect. The short channel effect lowers the reliability of the MOS transistor, due to a hot carrier effect, and degrades the electrical characteristics of the MOS transistor e.g., leakage current characteristics between the source and drain regions. As a result, MOS transistors have increasingly adopted the use of a lightly doped drain (LDD). In order to form a LDD region, it is necessary to form spacers at the side walls of a gate electrode. Also, the gate electrode of the MOS transistor must be formed of a conductive material film containing a metal silicide film having a low resistivity, in order to improve the operation speed of a semiconductor device.

FIGS. 1 through 3 are section views illustrating a related method for forming a MOS transistor.

Referring to FIG. 1, a gate dielectric film 3 is formed in a semiconductor substrate 1, and a polysilicon film 5, a titanium silicide film 7 and a gate protection film 9, which form a gate pattern 10, are stacked in sequence on a predetermined region of the gate dielectric film 3. The gate protection film 9 is formed as a silicon oxide film or silicon nitride film.

Referring to FIGS. 2 and 3, a silicon nitride film 11 having a predetermined thickness is formed over the entire surface of the semiconductor substrate 1 having the gate pattern 10. Preferably, the silicon nitride film 11 is formed to have a dense film quality in order to increase etching selectivity with respect to other dielectric films such as a silicon oxide film. Thus, the silicon nitride film 11 is formed at a high temperature of 750° C. to 800° C. Here, during the formation of the silicon nitride film 11, the titanium silicide film 7 is easily oxidized or deformed. Thus, a deformed titanium film 7a as shown in FIG. 2 is formed and simultaneously an undesired dielectric film 7b such as titanium oxide film is formed at the side walls of the deformed titanium silicide film 7a.

As a result, the width of the deformed titanium silicide film 7a, which actually contributes to the transfer of an electrical signal is decreased to less than the width of the initial titanium silicide film 7. As a result of this, the resistance of a gate electrode including the polysilicon film 5 and the deformed titanium silicide film 7a increases. Then, the silicon nitride film 11 is anisotropically etched to form spacers 11a at the side walls of the gate pattern 10.

According to the conventional method described above, the silicon nitride film for forming the spacers is formed at a high temperature of 750~800° C., so that the titanium suicide film of the gate electrode is deformed. As a result, the resistance of the gate electrode increases, thereby degrading the operation characteristics of the semiconductor device.

Such a phenomenon is serious in a MOS transistor used for a highly integrated semiconductor device, because of the short channel length of the MOS transistor, i.e., the narrow gate electrode of the MOS transistor.

SUMMARY OF THE INVENTION

To solve the above problems, it is an objective of the present invention to provide a method for forming a MOS transistor suitable for a highly integrated semiconductor device, capable of preventing the width of a gate pattern from decreasing while spacers are formed at side walls of the gate pattern.

To achieve the above objective, there is provided a method of forming a MOS transistor of a semiconductor device, comprising: forming a gate dielectric film over a semiconductor substrate, forming a gate pattern over a predetermined region of the gate dielectric film, forming a first dielectric film over the semiconductor substrate and the gate pattern at a first temperature, forming a second dielectric film over the first dielectric film at a second temperature higher than the first temperature, and anisotropically etching the second and first dielectric films in sequence to form bi-layered spacers on side walls of the gate pattern, the bi-layered spacers each including portions of the first and second dielectric films.

The step of forming a gate pattern may further comprise: forming a conductive film over the gate dielectric film, forming a gate protection film over the conductive film, and forming the gate pattern by patterning the gate protection film and the conductive film in sequence, such that the gate pattern comprises a conductive film pattern and a gate protection film pattern.

The conductive film in the gate pattern may comprises a polysilicon film and a metal silicide film, a polysilicon film and a metal film, or a metal film. The metal silicide film may comprise a material selected from the group consisting of titanium silicide, tungsten silicide, and tantalum silicide. The metal film may comprise a material selected from the group consisting of tungsten, titanium nitride, tantalum, and tungsten nitride.

The gate protection film may comprise a material selected from the group consisting of silicon nitride and silicon oxide.

The step of forming a gate pattern may further comprise: forming a conductive film over the gate dielectric film, and forming the gate pattern by patterning the conductive film. The conductive film may be formed by stacking a polysilicon film and a metal suicide film in sequence over the gate dielectric film.

The first dielectric film preferably comprises silicon nitride formed by plasma-enhanced chemical vapor deposition, and the second dielectric film preferably comprises silicon nitride formed by low-pressure chemical vapor deposition.

The first temperature is preferably chosen to be below a temperature at which the gate pattern will deform, e.g., a temperature lower than 500° C. The second temperature is higher than the first temperature and is preferably between 750° C. and 800° C.

In the MOS transistor formation method according to the present invention, the first dielectric film is formed at a low temperature at which the conductive film forming the gate pattern, particularly, the metal silicide film or metal film, is not deformed, which prevents a decrease in the cross-section area of the gate electrode. As a result, the low resistance of the gate electrode after the spacers are formed can be maintained, thereby realizing a MOS transistor capable of improving the operation characteristics of a highly integrated semiconductor device.

BRIEF DESCRIPTION OF THE DRAWINGS

The above objectives and advantages of the present invention will become more apparent by describing in detail a preferred embodiment thereof with reference to the attached drawings in which.

DESCRIPTION OF THE PREFERRED EMBODIMENT

Figure 1:
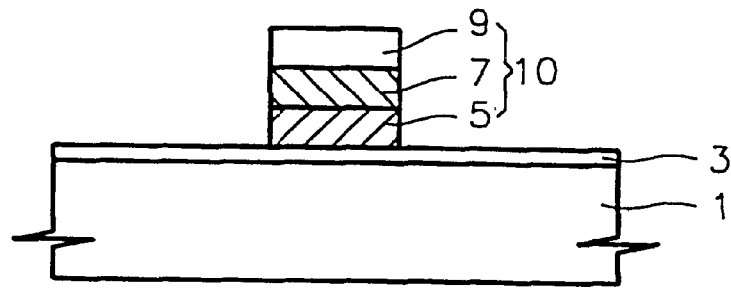
FIGS. 1 through 3 are section views illustrating a conventional method for forming a MOS transistor.
Figure 2:
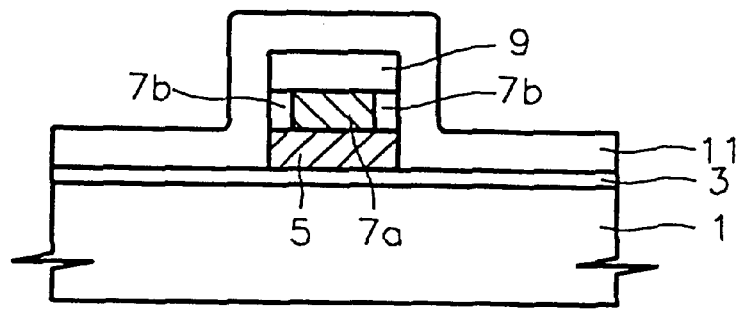
Figure 3:
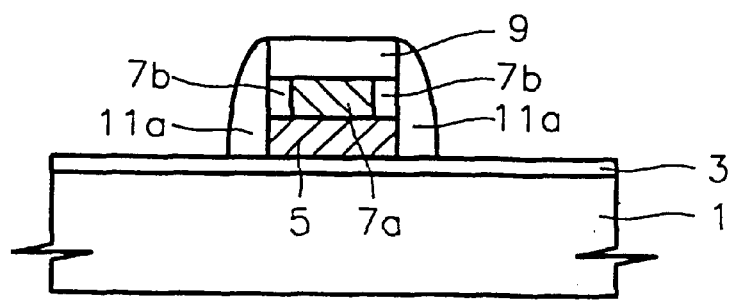

The present invention now will be described more fully with reference to the accompanying drawings, in which a preferred embodiment of the invention is shown. This invention may, however, be embodied in many different forms, and should not be construed as being limited to the embodiment set forth herein; rather, this embodiment is provided so that this disclosure will be thorough and complete, and will fully convey the concept of the invention to those skilled in the art. In the drawings, the thickness of layers and regions are exaggerated for clarity. Also, the same reference numerals in different drawings represent the same element. It will also be understood that when a layer is referred to as being "on" another layer or substrate, it can be directly on the other layer or substrate, or intervening layers may also be present.

Figure 4:
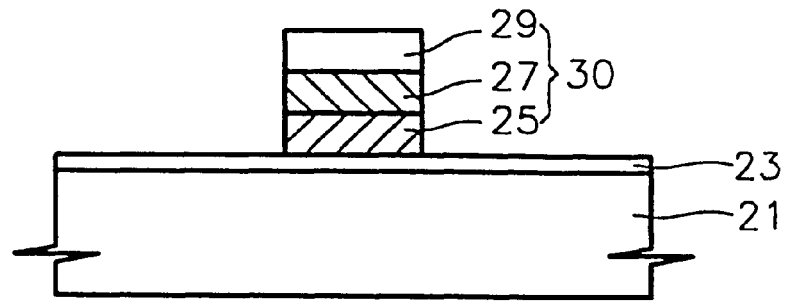
FIGS. 4 through 8 are section views illustrating a method for forming a MOS transistor according to the present invention.

Referring to FIG. 4, a gate dielectric film 23, e.g., a silicon oxide film, is formed on a semiconductor substrate 21. A conductive film and a gate protection film are formed in sequence over the gate dielectric film 23. The conductive film is preferably formed by stacking, in sequence, a polysilicon film and a metal silicide film, although a metal film may be used instead of the metal silicide film. The conductive film may also be formed using only a metal film without the polysilicon film.

Preferably, the polysilicon film is formed as an impurity-doped polysilicon film, and the metal silicide film preferably contains a refractory metal and silicon, e.g., a titanium silicide film, tungsten silicide film or tantalum silicide film. If a metal film is used, it is preferably a tungsten film, a titanium nitride film, a tantalum film or a tungsten nitride film. The gate protection film is preferably a silicon nitride film or silicon oxide film.

Preferably, the gate protection film is formed by chemical vapor deposition (CVD). Also, in alternate embodiments, the step of forming the gate protection film may be omitted.

The gate protection film and the conductive film are successively patterned to form a gate pattern 30 including a conductive film pattern and a gate protection film pattern 29 on a predetermined region of the gate dielectric film 23. The conductive film pattern may include a polysilicon film pattern 25 and a metal silicide film pattern 27, or the polysilicon pattern 25 and a metal film pattern. Also, the conductive film pattern may be formed as only a metal film pattern. In the case where the gate protection film is not formed, the gate pattern 30 is formed as only a conductive film pattern.

Figure 5:
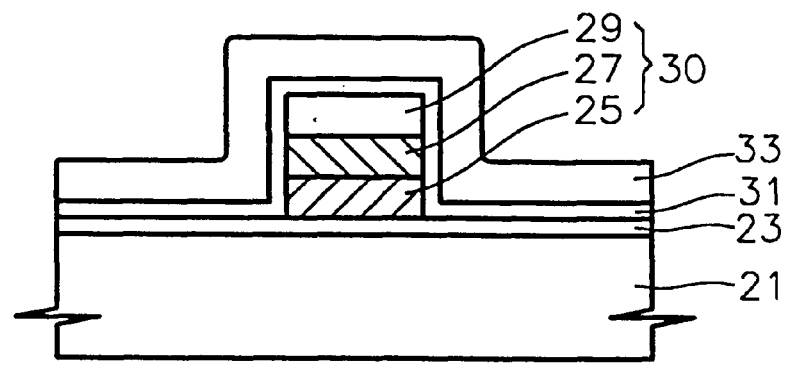

Referring to FIG. 5, a first dielectric film 31 and a second dielectric film 33 are formed in sequence on the entire surface of the semiconductor substrate 21 and the gate pattern 30. Preferably, the first and second dielectric films 31 and 33 are both silicon nitride films. However, the deposition temperature for the first dielectric film must be different from that for the second dielectric film 33. For example, the silicon nitride film used as the first dielectric film 31 is preferably formed by a plasma-enhanced CVD (PECVD) method at a first temperature, e.g., at 500° C. or less. The first temperature is chosen to be a temperature at which the conductive material films of the gate pattern 30, in particular, the metal silicide film pattern 27 or the metal film pattern, are not deformed. The silicon nitride film used as the second dielectric film 33 is preferably formed by a low pressure CVD (LPCVD) at a second temperature higher than the first temperature, e.g., at 750~800° C.

When the first and second dielectric films 31 and 33 are formed as above, the material films of the gate pattern 30, in particular, the metal silicide film pattern 27 or metal film pattern, are prevented from being oxidized or deformed, and the second dielectric film 33 can be denser than the first dielectric film 31. As a result, as shown in FIG. 5, this prevents any change in the width of the polysilicon film pattern 25 and the metal silicide film pattern 27 which form the gate pattern 30.

Figure 6:
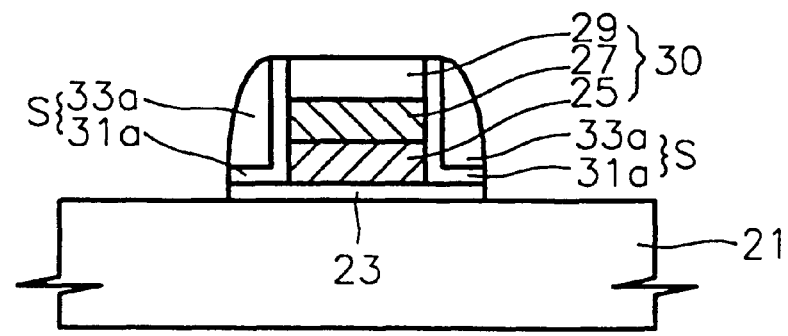

Referring to FIG. 6, the second and first dielectric films 33 and 31 are anisotropically etched successively to form bi-layered spacers S, including first and second dielectric film patterns 31a and 33a, on the side walls of the gate pattern 30. The gate dielectric film 23 at both sides of the gate pattern 30 may be over etched to expose the surface of the semiconductor substrate 21.

Figure 7:
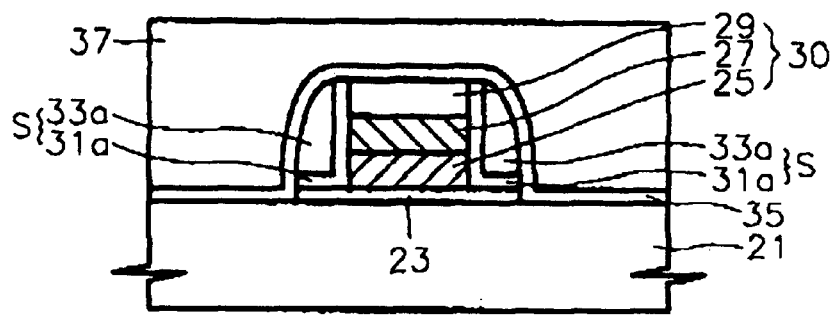
Figure 8:
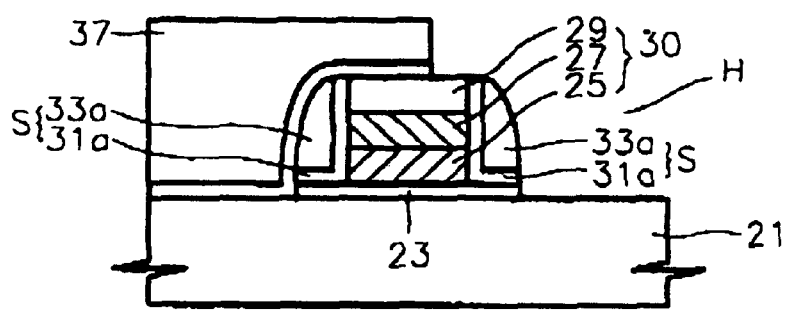

FIGS. 7 and 8 are section views illustrating the step of forming a self-aligned contact hole H after forming the spacers S. In detail, impurity ions are implanted into the entire surface of the semiconductor substrate 21 having the spacers S, using the gate pattern 30 and the spacers S as a mask for ion implantation. In this way source/drain regions (not shown) are formed in the surface of the semiconductor substrate 21 on both sides of the gate pattern 30.

A thin etch stop layer 35 having a thickness of approximately 100Å, and an interlayer dielectric (ILD) film 37, are then formed in sequence on the entire surface of the semiconductor substrate having the source/drain regions. Preferably, the ILD film 37 is formed of boro-phospho-silicate glass (BPSG) planarized by flowing at approximately 850° C. The etch stop layer 35 is preferably a silicon nitride film formed by low-pressure chemical vapor deposition (LPCVD).

The ILD film 37 is preferably etched using a mask for forming a self-aligned contact hole, thereby exposing the etch stop layer 35 formed on the edge of the gate pattern 30, the spacers S, and the semiconductor substrate 21. The exposed etch stop layer 35 is selectively etched to form a self-aligned contact hole H exposing the source/drain region formed at one side of the gate pattern 30.

Figure 9:
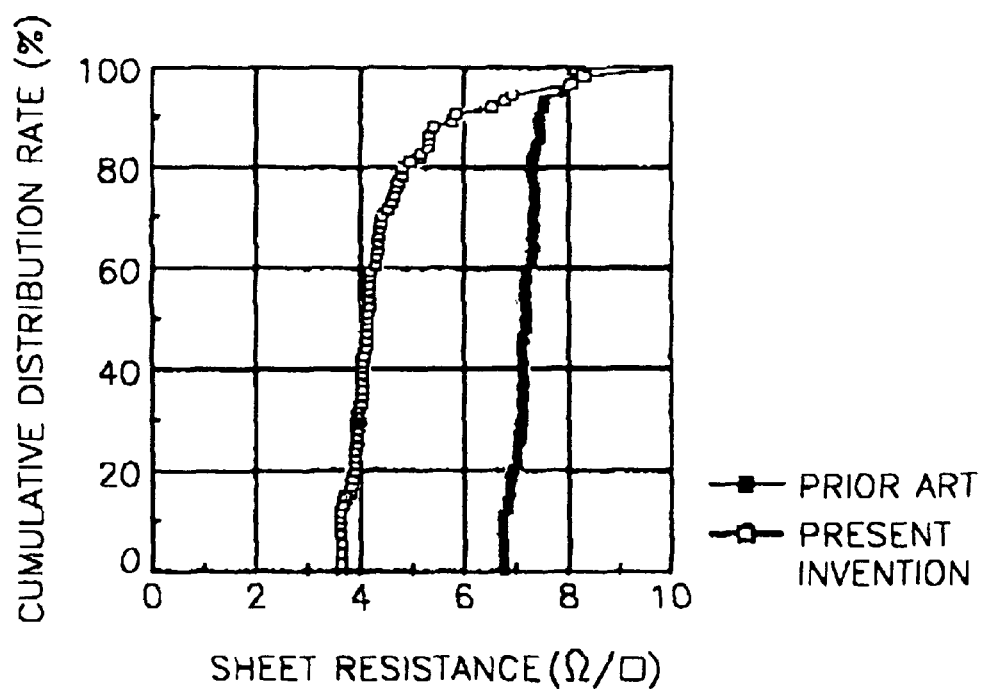
FIG. 9 is a graph showing resistance of gate electrodes of MOS transistors formed by the conventional method and the method of the present invention.

FIG. 9 is a graph showing the sheet resistance of gate electrodes of MOS transistors formed by the conventional method and the method according to a preferred embodiment of the present invention. The horizontal axis represents sheet resistance and the vertical axis represents the cumulative distribution rate of the sheet resistance.

In this embodiment of the present invention, the polysilicon film and the metal silicide film forming the gate electrode were formed as a doped polysilicon film and a titanium silicide film, each having a thickness of approximately 1,000Å. The polysilicon film was doped using phosphoryl chloride (POCl$_3$), and the titanium suicide film was formed by sputtering at 400° C. Also, the first and second dielectric films for forming the spacers were silicon nitride films having thicknesses of 200Å and 500Å, respectively. The silicon nitride film used as the first dielectric film was formed by PECVD at 400° C., and the silicon nitride film used as the second dielectric film was formed by LPCVD at 750° C. The PECVD was performed using silane (SiH$_4$) and ammonia (NH$_3$) reaction gases under a nitrogen plasma atmosphere, and the LPCVD process was performed using dichlorosilane (SiH$_2$Cl$_2$) and ammonia reaction gases at a low pressure of 0.3 Torr.

Also, the width of a test pattern for forming the gate electrode including the polysilicon film and titanium silicide film, was 0.17 μm on a mask. A polysilicon film and a metal silicide film forming a conventional gate electrode were formed under the same conditions as in the present invention, and a silicon nitride film for forming spacers was formed to a thickness of 700Å at 750° C. by LPCVD.

Referring to FIG. 9, the sheet resistance of the gate electrode of the conventional MOS transistor is approximately 6.5~7Ω/□ in 80% of samples. Meanwhile, the sheet resistance of the gate electrode of the MOS transistor according to the preferred embodiment of the present invention is approximately 3.3~4.5Ω/□ in 80% of samples. As a result, the MOS transistor formation method according to the present invention can suppress the deformation or oxidation of the gate electrode during the formation of the dielectric film for forming spacers. This has the desirable effect of maintaining a low sheet resistance of the gate electrode.

As described above, in the MOS transistor formation method according to the present invention, the first dielectric film for forming spacers is formed at a low temperature to prevent the deformation or oxidation of the gate electrode. As a result, the real width of the gate electrode is maintained, preventing the sheet resistance of the gate electrode from increasing as the spacers are formed. This effect is remarkable in a MOS transistor having a short channel. As a result, the present invention is suitable for forming a MOS transistor used for a highly integrated semiconductor device.

While the present invention has been illustrated and described with reference to a specific embodiment, further modifications and alterations within the spirit and scope of this invention will occur to those skilled in the art.

What is claimed is:

1. A method of forming a MOS transistor of a semiconductor device, comprising:

forming a gate dielectric film over a semiconductor substrate;

forming a gate pattern over a predetermined region of the gate dielectric film;

forming a first silicon nitride film over the semiconductor substrate and the gate pattern at a first temperature;

forming a second silicon nitride film over the first silicon nitride film at a second temperature higher than the first temperature; and anisotropically etching the second and first silicon nitride films in sequence to form bi-layered spacers on side walls of the gate pattern, the bi-layered spacers each including portions of the first and second silicon nitride films.

2. A method of forming a MOS transistor of a semiconductor device, as recited in claim 1, wherein the step of forming a gate pattern further comprises:

forming a conductive film over the gate dielectric film;

forming a gate protection film over the conductive film; and forming the gate pattern by patterning the gate protection film and the conductive film in sequence, such that the gate pattern comprises a conductive film pattern and a gate protection film pattern.

3. A method of forming a MOS transistor of a semiconductor device, as recited in claim 2, wherein the conductive film comprises a polysilicon film and a metal suicide film.

4. A method of forming a MOS transistor of a semiconductor device, as recited in claim 3, wherein the metal suicide film comprises a material selected from the group consisting of titanium suicide, tungsten silicide, and tantalum silicide.

5. A method of forming a MOS transistor of a semiconductor device, as recited in claim 2, wherein the conductive film comprises a polysilicon film and a metal film.

6. A method of forming a MOS transistor of a semiconductor device, as recited in claim 5, wherein the metal film comprises a material selected from the group consisting of tungsten, titanium nitride, tantalum, and tungsten nitride.

7. A method of forming a MOS transistor of a semiconductor device, as recited in claim 2, wherein the conductive film comprises a metal film.

8. A method of forming a MOS transistor of a semiconductor device, as recited in claim 7, wherein the metal film comprises a material selected from the group consisting of tungsten, titanium nitride, tantalum, and tungsten nitride.

9. A method of forming a MOS transistor of a semiconductor device, as recited in claim 2, wherein the gate protection film comprises a material selected from the group consisting of silicon nitride and silicon oxide.

10. A method of forming a MOS transistor of a semiconductor device, as recited in claim 1, wherein the step of forming a gate pattern further comprises:

forming a conductive film over the gate dielectric film; and forming the gate pattern by patterning the conductive film.

11. A method of forming a MOS transistor of a semiconductor device, as recited in claim 10, wherein the conductive film is formed by stacking a polysilicon film and a metal silicide film in sequence over the gate dielectric film.

12. A method of forming a MOS transistor of a semiconductor device, as recited in claim 11, wherein the metal silicide film comprises a material selected from the group consisting of titanium silicide, tungsten silicide, and tantalum silicide.

13. A method of forming a MOS transistor of a semiconductor device, as recited in claim 10, wherein the conductive film is formed by stacking a polysilicon film and a metal film in sequence over the gate dielectric film.

14. A method of forming a MOS transistor of a semiconductor device, as recited in claim 13, wherein the metal film comprises a material selected from the group consisting of tungsten, titanium nitride, tantalum, and tungsten nitride.

15. A method of forming a MOS transistor of a semiconductor device, as recited in claim 10, wherein the conductive film comprises a metal film.

16. A method of forming a MOS transistor of a semiconductor device, as recited in claim 15, wherein the metal film comprises a material selected from the group consisting of tungsten, titanium nitride, tantalum, and tungsten nitride.

17. A method of forming a MOS transistor of a semiconductor device, as recited in claim 1, wherein the first temperature is chosen to be below a temperature at which the gate pattern will deform.

18. A method of forming a MOS transistor of a semiconductor device, as recited in claim 1, wherein the first temperature is lower than 500° C.

19. A method of forming a MOS transistor of a semiconductor device, as recited in claim 1, wherein the second temperature is between 750° C. and 800° C.

20. A method of forming a MOS transistor of a semiconductor device, as recited in claim 1, wherein the first silicon nitride film is formed by plasma-enhanced chemical vapor deposition.

21. A method of forming a MOS transistor of a semiconductor device, as recited in claim 1, wherein the second silicon nitride film formed by low-pressure chemical vapor deposition.

* * * * *